(12) United States Patent
Ono et al.

(10) Patent No.: US 9,007,055 B2
(45) Date of Patent: Apr. 14, 2015

(54) SELF-PINNED SPIN VALVE MAGNETORESISTANCE EFFECT FILM AND MAGNETIC SENSOR USING THE SAME, AND ROTATION ANGLE DETECTION DEVICE

(75) Inventors: Tomoki Ono, Tottori (JP); Yasunori Abe, Nagaokakyo (JP); Fumio Shirasaki, Tottori (JP)

(73) Assignee: Hitachi Metals, Ltd., Tokyo (JP)

( * ) Notice: Subject to any disclaimer, the term of this patent is extended or adjusted under 35 U.S.C. 154(b) by 685 days.

(21) Appl. No.: 13/057,076

(22) PCT Filed: Aug. 10, 2009

(86) PCT No.: PCT/JP2009/003833
§ 371 (c)(1),
(2), (4) Date: Mar. 16, 2011

(87) PCT Pub. No.: WO2010/029684
PCT Pub. Date: Mar. 18, 2010

(65) Prior Publication Data
US 2011/0163739 A1    Jul. 7, 2011

(30) Foreign Application Priority Data
Sep. 12, 2008    (JP) .................................. 2008-235477

(51) Int. Cl.
*G01B 7/30* (2006.01)
*G01R 33/09* (2006.01)
(Continued)

(52) U.S. Cl.
CPC .............. *G01R 33/093* (2013.01); *B82Y 25/00* (2013.01); *H01F 10/325* (2013.01); *H01F 10/3254* (2013.01); *H01L 43/08* (2013.01)

(58) Field of Classification Search
USPC ........................................... 324/207.21, 252
See application file for complete search history.

(56) References Cited

U.S. PATENT DOCUMENTS 5,856,897 A    1/1999  Mauri
6,052,262 A    4/2000  Kamiguchi et al.
(Continued)

FOREIGN PATENT DOCUMENTS

GB    2 400 719 A    10/2004
JP    A-9-184703    7/1997
(Continued)

OTHER PUBLICATIONS

Machine English translation of International Patent Application Publication to Applicants Aimuta K, et al. WO 2008/062778 A1, May 29, 2008. Translation of Description, created on May 18, 2013.*
(Continued)

*Primary Examiner* — Melissa Koval
*Assistant Examiner* — Stephen G Armstrong
(74) *Attorney, Agent, or Firm* — Oliff PLC

(57) ABSTRACT

Provided are a self-pinned spin valve magnetoresistance effect film, a magnetic sensor using the same, and a rotation angle detection device. The self-pinned spin valve magnetoresistance effect film has a strong coupling magnetic field in a pinned layer, a small reduction in the change in resistance, and superior resistance to magnetic fields without reducing the coercive force in a first ferromagnetic layer, which is a pinned layer in the film, even when exposed to a strong external magnetic field. By inserting a non-magnetic layer between a ground layer and a pinned layer to form the spin valve magnetoresistance effect film, the self-pinned spin valve magnetoresistance effect film having superior resistance to magnetic fields, a magnetic sensor using the same, and a rotation angle detection device are obtained.

6 Claims, 13 Drawing Sheets

(51) Int. Cl.
*B82Y 25/00* (2011.01)
*H01F 10/32* (2006.01)
*H01L 43/08* (2006.01)

(56) References Cited

U.S. PATENT DOCUMENTS

| | | | |
|---|---|---|---|
| 6,452,761 B1 * | 9/2002 | Carey et al. | 360/320 |
| 6,560,078 B1 * | 5/2003 | Pinarbasi | 360/324.11 |
| 6,665,153 B1 | 12/2003 | Hayashi | |
| 6,836,392 B2 * | 12/2004 | Carey et al. | 360/324.11 |
| 2002/0021537 A1 | 2/2002 | Hasegawa et al. | |
| 2002/0086182 A1 | 7/2002 | Fujikata et al. | |
| 2004/0086752 A1 | 5/2004 | Matsukawa et al. | |
| 2004/0207959 A1 | 10/2004 | Saito | |
| 2005/0018363 A1 | 1/2005 | Hasegawa et al. | |
| 2005/0195536 A1 | 9/2005 | Kagami et al. | |
| 2005/0207072 A1 | 9/2005 | Matsuzaka et al. | |
| 2005/0280953 A1 | 12/2005 | Hasegawa et al. | |

FOREIGN PATENT DOCUMENTS

| | | |
|---|---|---|
| JP | H09-184703 A | 7/1997 |
| JP | B2-2812042 | 8/1998 |
| JP | A-10-321930 | 12/1998 |
| JP | B2-3033934 | 2/2000 |
| JP | B2-3040750 | 3/2000 |
| JP | A-2002-204002 | 7/2002 |
| JP | A-2002-519873 | 7/2002 |
| JP | A-2003-86865 | 3/2003 |
| JP | A-2005-44489 | 2/2005 |
| JP | 2005-268570 A | 9/2005 |
| JP | A-2006-5282 | 1/2006 |
| JP | 2006-208255 A | 8/2006 |
| JP | A-2006-208255 | 8/2006 |
| WO | WO 2008062778 A1 * | 5/2008 |

OTHER PUBLICATIONS

Leal, J.L. et al., "Spin Valves Exchange Biased By Co/Ru/Co Synthetic Antiferromagnets," *Journal of Applied Physics*, Apr. 1, 1998, pp. 3720-3723, vol. 83, No. 7.

International Search Report issued in International Application No. PCT/JP2009/003833 on Jan. 26, 2010 (with translation).

International Preliminary Report on Patentability issued in International Application No. PCT/JP2009/003833 on May 10, 2011 (with translation).

Office Action dated Aug. 13, 2013 issued in Japanese Patent Application No. 2010-528602 (with translation).

Office Action dated Dec. 24, 2013 issued in Japanese Patent Application No. 2010-528602 (with English translation).

Jan. 6, 2015 Office Action issued in Japanese Application No. 2010-528602.

* cited by examiner

EXAMPLE

COMPARATIVE EXAMPLE

EXAMPLE

COMPARATIVE EXAMPLE

SELF-PINNED SPIN VALVE MAGNETORESISTANCE EFFECT FILM AND MAGNETIC SENSOR USING THE SAME, AND ROTATION ANGLE DETECTION DEVICE

TECHNICAL FIELD

The present invention relates to a self-pinned spin valve magnetoresistance effect film and a magnetic sensor using the same, and a rotation angle detection device.

BACKGROUND ART

A magnetic sensor which uses a magnetoresistance effect element is useful for detecting a change of a physical amount in a non-contacting manner. In a magnetic sensor which detects a rotation angle (hereinafter referred to as a rotation angle sensor), a superior detection sensitivity of the magnetoresistance effect element with respect to a rotational magnetic field is required.

As a film used for the magnetoresistance effect element, there exist an anisotropic magnetoresistance effect (AMR) film, a coupling giant magnetoresistance effect (GMR) film, a spin valve giant magnetoresistance effect (SVGMR) film, etc.

A magnetoresistance effect element which uses the AMR film is normally formed by patterning a single layer film of a NiFe alloy thin film or the like. Although the process is simple, the change in resistance of the element of only approximately 3% can be obtained.

On the other hand, Patent Literature 1 shows a magnetoresistance effect element which uses the GMR film. Unlike the magnetoresistance effect element which uses the AMR film, the magnetoresistance effect element of Patent Literature 1 uses an artificial lattice metal film in which a few tens of layers of NiCoFe alloy thin films and non-magnetic metal thin films are alternately layered. This magnetoresistance effect element can achieve a large change in resistance which is 2-4 times that of the magnetoresistance effect element which uses the AMR film.

Patent Literature 2 discloses a magnetoresistance effect element which uses the SVGMR film (a replay head of a magnetic disk device). The SVGMR film used in the magnetoresistance effect element of Patent Literature 2 comprises a pinned layer, a free layer, and a non-magnetic layer. The pinned layer is configured such that a magnetization direction is not changed even when the direction of magnetic field (magnetic flux) changes. The free layer is configured such that the magnetization direction changes following the change of the magnetic field. The non-magnetic layer magnetically separates the pinned layer and the free layer. The resistance is minimized when the magnetization directions of the pinned layer and the free layer are parallel to each other, and the resistance is maximized when the magnetization directions are anti-parallel to each other. The magnetoresistance effect element using the SVGMR film shows a high change in resistance of greater than or equal to that of the magnetoresistance effect element using the GMR film. The magnetoresistance effect element using the SVGMR film shows a change in resistance of greater than or equal to 7% with a very weak magnetic field (0.8~2 kA/m (approximately 10~20 Oe)), and can be used for a magnetic sensor which requires a high detection sensitivity.

As the SVGMR film, a structure is widely known with an antiferromagnetic layer/a ferromagnetic layer/an intermediate layer/a free layer/a protection layer (hereinafter referred to as "antiferromagnetic SVGMR film"). The antiferromagnetic layer is formed using an antiferromagnetic material, and applies a unidirectional anisotropy to the magnetization of the pinned layer. On the other hand, there also is known a structure in which the antiferromagnetic layer is not provided and the pinned layer is formed in a structure of a first ferromagnetic layer/an antiferromagnetic coupling layer/a second ferromagnetic layer (hereinafter referred to as a "self-pinned SVGMR film"). Magnetoresistance effect elements using such a self-pinned SVGMR film are disclosed in Patent Literature 3, Patent Literature 4, and Non-Patent Literature 1.

In order to create a rotation angle sensor which detects angles of 360 degrees using the SVGMR film, magnetizations of the pinned layers in a plurality of directions are necessary. Because of this, when a rotation angle sensor is to be created using the antiferromagnetic SVGMR film which is unidirectionally anisotropic, a plurality of sensor elements which are unidirectionally anisotropic must be used, and thus difficulty arises in integrating the sensor elements.

On the other hand, because the self-pinned SVGMR film does not have the antiferromagnetic layer, a rotation angle sensor in which anisotropies in 4 directions are applied in one sensor element can be created by layering self-pinned SVGMR films over a same substrate, and the integration of the sensor elements can be easily achieved.

In addition, there are a high-temperature limit temperature known as Néel temperature for the antiferromagnetic layer of the antiferromagnetic SVGMR film and a high-temperature limit temperature known as a blocking temperature for an exchange coupling force of the pinned layer, and when this temperature is reached, the exchange coupling force substantially disappears. In addition, because the exchange coupling force is reduced as the temperature becomes close to the blocking temperature, the exchange coupling force may become insufficient even when the temperature is lower than the blocking temperature, resulting a difficulty in achieving a sufficient precision for the rotation angle sensor using the antiferromagnetic SVGMR film under a high temperature.

BACKGROUND ART DOCUMENTS

Patent Literature

[Patent Literature 1] JP 2812042
[Patent Literature 2] JP 3040750
[Patent Literature 3] JP 3033934
[Patent Literature 4] JP 2002-519873 A

Non-Patent Literature

[Non-Patent Literature 1] J. L. Leal, "Spin valves exchange biased by Co/Ru/Co synthetic antiferromagnets", "Journal of Applied Physics", (U.S.A.), 1998, volume 83, number 7, p. 3720

DISCLOSURE OF INVENTION

Technical Problem

When the coupling magnetic field of the pinned layer is continued to be directed in a certain direction, as the external magnetic field is increased, the magnetization direction of the free layer becomes closer to parallel with the direction of the external magnetic field, so that the angle detection direction and the magnetization direction of the free layer of the magnetoresistance effect element coincide with each other at a higher degree and an error in the rotation angle should be reduced. However, when the self-pinned SVGMR layers of Patent Literature 3 were layered to create a sample of a rotation angle sensor and the error characteristic of the rotation angle was evaluated, it was found that the error in the rotation angle was not reduced following the external magnetic field in an external magnetic field of greater than or equal to 8 (kA/m). This result indicates that the induction magnetic field direction of the pinned layer which is assumed to be not moving in this range of magnetic field is fluctuated by the external magnetic field. As a result of a more detailed examination of the coupling magnetic field of the pinned layer, it was found that a coercive force of the first ferromagnetic layer which is the pinned layer has become approximately ¼ of the designed value (coercive force of a single layer film).

In the case of the self-pinned SVGMR film, the reduction in the coercive force of the pinned layer results in reduction in the coupling magnetic field. Thus, the self-pinned SVGMR film of this sample can be considered as having a reduced change in resistance because the coupling of the pinned layer is loosened as the external magnetic field is increased. Such a result is not preferred when a rotation angle sensor is created using the self-pinned SVGMR film because an angle error variation may be caused at a strong external magnetic field.

An object of the present invention is to provide a self-pinned SVGMR film having a strong coupling magnetic field of a pinned layer, a small reduction in the change in resistance, and a superior resistance to magnetic field without reducing the coercive force of the first ferromagnetic layer which is the pinned layer of the self-pinned SVGMR film even when exposed to a strong external magnetic field, a magnetic sensor using the self-pinned SVGMR film, and a rotation angle detection device.

Solution to Problem

A self-pinned SVGMR film according to the present invention preferably is a self-pinned SVGMR film in which a ground layer, a pinned layer, an intermediate layer, a free layer, and a protection layer are layered in this order over a non-magnetic substrate, wherein a non-magnetic layer is formed between the ground layer and the pinned layer.

The ground layer over the non-magnetic substrate is provided for improving a crystal orientation of the pinned layer. The ground layer may have a layered structure of a Ta layer and a NiFeCr alloy layer. The pinned layer having a magnetic anisotropy comprises 3 layered films of a ferromagnetic layer on a side near the ground layer, an exchange coupling layer, and a ferromagnetic layer on a side near the intermediate layer. A CoFe alloy layer may be used for the ferromagnetic layer on the side near the ground layer, a Ru layer may be used for the exchange coupling layer, and a CoFe alloy layer may be used for the ferromagnetic layer on the side near the intermediate layer. A Cu layer or the like may be used for the intermediate layer which is a non-magnetic and conductive layer. The free layer comprises a ferromagnetic layer in which the magnetization direction changes corresponding to an external magnetic field. For the free layer, a CoFe alloy layer may be used for the side near the intermediate layer and a NiFe alloy layer or the like may be used for the side near the protection layer. The protection layer is an oxidation prevention layer of the self-pinned SVGMR film including the free layer, intermediate layer, pinned layer, and ground layer, and may be preferably formed with a non-magnetic metal. The materials of the layers of the self-pinned SVGMR film of the present invention are not limited to those described above.

For the film formation of the self-pinned SVGMR film, methods such as evaporation and sputtering may be used. When the film is formed through sputtering in which film thickness and film composition can be easily controlled, if a unnecessary oxide film is formed between the layers, the characteristic of the self-pinned SVGMR film cannot be stably obtained, and thus the layers may be sequentially formed through sputtering using multi-target within the same vacuum.

When the ground layer and the pinned layer are in contact with each other, the coercive force of the ferromagnetic layer of the pinned layer on the side near the pinned layer is reduced. When the coercive force is reduced, the coupling magnetic field is weakened, the coupling of the pinned layer is loosened as the external magnetic field is increased, and the change in resistance of the self-pinned SVGMR film is reduced. In consideration of this, the non-magnetic layer is inserted between the ground layer and the pinned layer, to separate the ground layer and the pinned layer. With such a configuration, a self-pinned SVGMR film can be realized in which the reduction in the change in resistance is low even when exposed to a strong external magnetic field.

Advantageous Effects of Invention

According to the present invention, a self-pinned SVGMR film having a strong coupling magnetic field of the pinned layer, a small reduction of the change in resistance, and a superior resistance to magnetic field without reduction of the coercive force of the first ferromagnetic layer which is the pinned layer of the self-pinned SVGMR film even when exposed to a strong external magnetic field, a magnetic sensor using the self-pinned SVGMR film, and a rotation angle detection device can be provided.

BEST MODE FOR CARRYING OUT THE INVENTION

Figure 1:
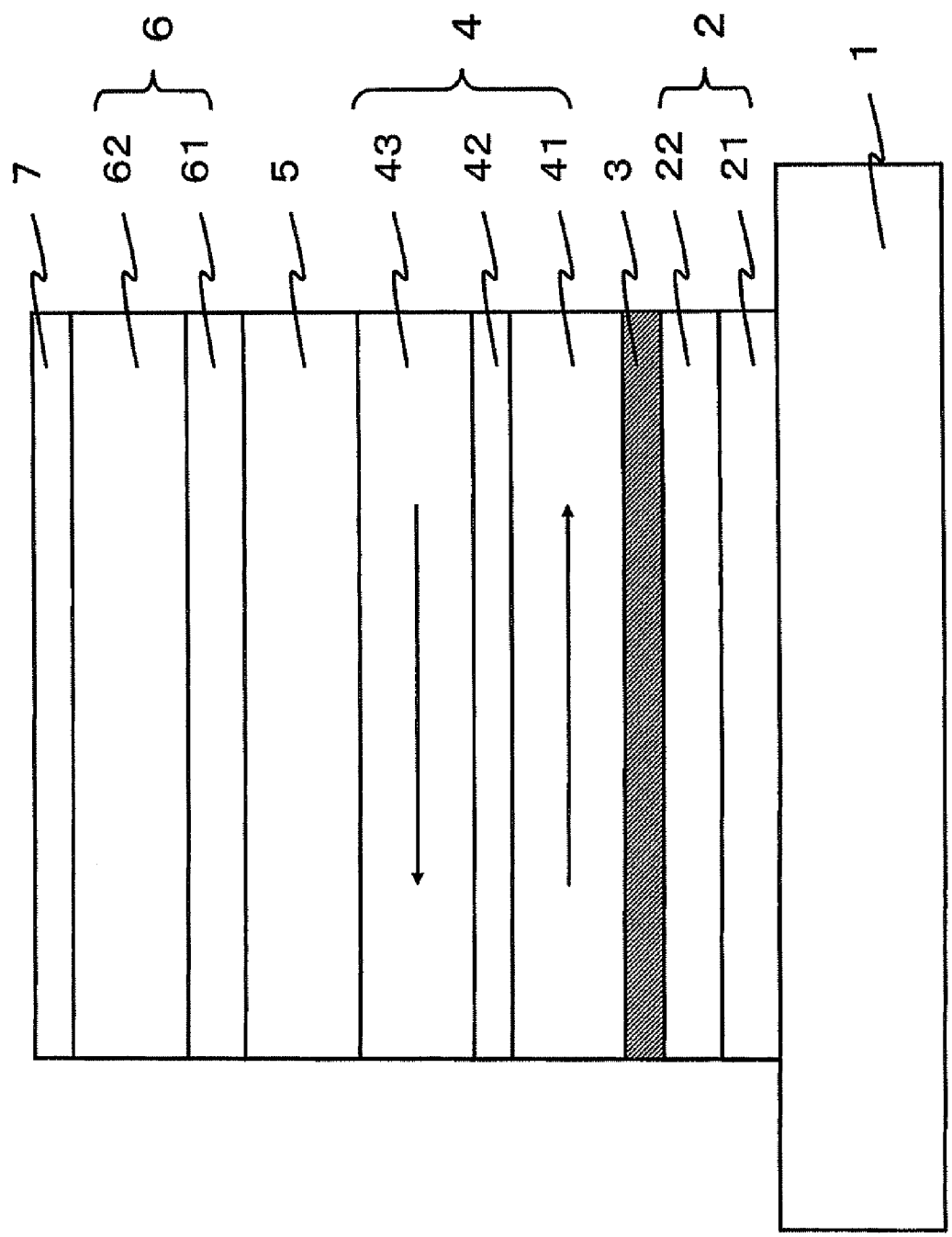
FIG. 1 is a cross sectional diagram showing a structure of a self-pinned SVGMR film according to a first example of the present invention.

A preferred embodiment of the present invention will now be described in detail based on examples and with reference to the drawings. In order to simplify the explanation, the same component and same part are assigned the same reference numerals.

As exemplified in FIG. 1, a self-pinned spin valve magnetoresistance effect film (SVGMR film) according to a preferred embodiment of the present invention comprises a non-magnetic substrate 1, and a ground layer 2, a pinned layer 4, an intermediate layer 5, a free layer 6, and a protection layer 7 layered over the substrate 1 in this order. In addition, in the present embodiment, a non-magnetic layer 3 is formed between the ground layer 2 and the pinned layer 4.

The ground layer 2 has a layered structure including a first ground layer 21 and a second ground layer 22. The first ground layer 21 may be a Ta layer and the second ground layer may be a NiFeCr alloy layer. The ground layer 21 is provided for improving the crystal orientation of the pinned layer 4.

The pinned layer 4 has a magnetic anisotropy, and has 3 layered films of a first ferromagnetic layer 41 provided on a side near the ground layer 2, an exchange coupling layer 42, and a second ferromagnetic layer 43 provided on a side near the intermediate layer 5. A CoFe alloy layer may be used for the first ferromagnetic layer 41 on the side near the ground layer 2. In addition, a Ru layer may be used for the exchange coupling layer 42. Moreover, a CoFe alloy layer or the like may be used for the second ferromagnetic layer 43 on the side near the intermediate layer. A Cu layer or the like may be used for the intermediate layer 5 which is a non-magnetic and conductive layer.

The free layer 6, which is the ferromagnetic layer in which the magnetization direction changes corresponding to the external magnetic field, comprises a first free layer 61 and a second free layer 62. A CoFe alloy layer, may be used for the first free layer 61 on a side near the intermediate layer 5. A NiFe alloy layer may be used for the second free layer 62 on a side near the protection layer 7. The protection layer 7 is an oxidation prevention layer of the self-pinned SVGMR film including the free layer 6, the intermediate layer 5, the pinned layer 4, and the ground layer 2, and may have a structure in which a non-magnetic metal is formed. The materials of the layers of the self-pinned SVGMR film in the present embodiment are not limited to those described above.

In addition, in the present embodiment, the non-magnetic layer 3 is inserted between the ground layer 2 and the pinned layer 4 in consideration of the fact that, when the ground layer 2 and the pinned layer 4 are directly in contact with each other, the coercive force of the ferromagnetic layer included in the pinned layer 4 is reduced, the coupling magnetic field is weakened, and, as the external magnetic field is increased, the coupling of the pinned layer 4 is loosened and the change in resistance of the self-pinned SVGMR film is reduced. With such a configuration, the ground layer 2 and the pinned layer 4 are separated, and a self-pinned SVGMR film is realized in which the reduction in the change in resistance is small even when exposed to a strong external magnetic field.

If the non-magnetic layer 3 is too thin, the advantage of separating the ground layer 2 and the pinned layer 4 is weakened, the coercive force of the ferromagnetic layer of the pinned layer 4 is reduced, and, when the coercive force is reduced, the coupling magnetic field is weakened, and the coupling of the pinned layer 4 is loosened as the applied magnetic field is increased, resulting in reduction of the coupling magnetic filed and the reduction in the change in resistance. Therefore, in order to prevent reduction of the coupling magnetic field of the pinned layer 4 of the self-pinned SVGMR film and prevent reduction in the change in resistance, the thickness of the non-magnetic layer 3 may be set to greater than or equal to 3 Å. In other words, in the self-pinned SVGMR film of the present embodiment, the thickness of the non-magnetic layer 3 formed between the ground layer 2 and the pinned layer 4 may be greater than or equal to 3 Å.

On the other hand, if the non-magnetic layer 3 is too thick, the current flowing in the intermediate layer 5 of the self-pinned SVGMR film is divided to the side of the non-magnetic layer 3 and the change in resistance is reduced. In addition, the advantage of the ground layer 2 to improve the crystal orientation of the pinned layer 4 is weakened, and the induction magnetic anisotropy of the free layer 6 is increased. Therefore, a preferable range of the thickness of the non-magnetic layer 3 is determined in order to prevent increase in the induction magnetic anisotropy of the free layer of the self-pinned SVGMR film and prevent reduction of the change in resistance. In the present embodiment, the non-magnetic layer 3 has a thickness of, for example, less than or equal to 20 Å, for example, less than or equal to 5 Å.

The non-magnetic layer 3 of the self-pinned SVGMR film is preferably formed by at least one layer selected from among a metal or a metal compound such as a metal oxide, a metal carbide, and a metal nitride.

For the non-magnetic layer 3, a conductive material or an insulating material may be used so long as the layer does not adversely affect the magnetic characteristic of the self-pinned SVGMR film and does not reduce the change in resistance. For the film formation of the non-magnetic layer, sputtering which allows easy control of the thickness and film composition may be used, but alternatively, other methods such as evaporation may be employed. The sputtering film formation of the metal oxide and metal nitride film may use a reactive sputtering in which a metal target is sputtered within a reaction gas. When a unnecessary oxide film is formed between layers, stable characteristic of the self-pined SVGMR film cannot be obtained, and thus, when the self-pinned SVGMR film of the present embodiment is to be formed through sputtering, the layers may be sequentially formed through sputtering using multi-target within the same vacuum.

The non-magnetic layer 3 of the self-pinned SVGMR film of the present embodiment may be formed by a metal or a metal compound, with the metal being at least one metal or alloy selected from Ta, V, Ti, Zr, Y, Hf, W, Re, Os, Ir, Pt, Nb, Mo, Ru, Rh, Pd, Al, Cu, Ag, Au, Fe, Ni, and Co.

As the metal used for the non-magnetic layer 3, any of the above-described metal may be used so long as the magnetic characteristic of the self-pinned SVGMR film is not adversely affected and the change in resistance is not reduced. When sputtering is employed for forming the non-magnetic layer 3, the layers including the non-magnetic layer 3 are preferably sequentially formed through sputtering using multi-target in a same vacuum and the number of targets to be used is preferably low in consideration of the manufacturing. Therefore, a metal type for forming the self-pinned SVGMR may be employed as the metal type for the non-magnetic layer 3. Although some of the metals are ferromagnetic when the metal is alone such as Fe, Co, and Ni, it is possible to use the metal for the non-magnetic layer 3 if the alloy of the metal is non-magnetic.

In one particular example configuration of the present embodiment, the non-magnetic layer 3 of the self-pinned SVGMR film may be an oxide of the metal of the ground layer formed by oxidizing the surface of the ground layer 2 on a side near the pinned layer 4. That is, for the non-magnetic layer 3, an oxide of the metal of the ground layer obtained by oxidizing the surface of the ground layer 2 on the side near the pinned layer 4 may be used so long as the magnetic characteristic of the self-pinned SVGMR film is not adversely affected and the change in resistance is not reduced. When the oxide of the metal of the ground layer is used, it is not necessary to newly form the non-magnetic layer 3, and the non-magnetic layer 3 may be formed by merely oxidizing the surface of the metal ground layer after the metal ground layer is formed. The oxidation of the surface of the metal ground layer may be achieved by exposing the substrate to the atmosphere after the metal ground layer is formed, or alternatively, the film formation chamber may be set to an oxygen atmosphere and oxidation process may be executed using a method such as plasma irradiation. With the method of setting the film formation chamber to the oxygen atmosphere and irradiating plasma, the thickness of the oxide film can be easily controlled.

The magnetization of the free layer 6 which is soft magnetic is stabilized in a direction to minimize a magnetostatic energy, because of the relationship between the external magnetic field and the induction magnetic anisotropy. Therefore, the increase in the induction magnetic anisotropy of the free layer 6 would obstruct the tendency of the external magnetic field and the magnetization of the free layer 6 to become parallel to each other, and, thus, is not preferable. In order to detect a rotation angle with a high precision with a rotation angle sensor using the self-pinned SVGMR film of the present embodiment, it is preferable that the direction of the external magnetic field and the magnetization direction of the free layer 6 of the self-pinned SVGMR film match each other.

Figure 2:
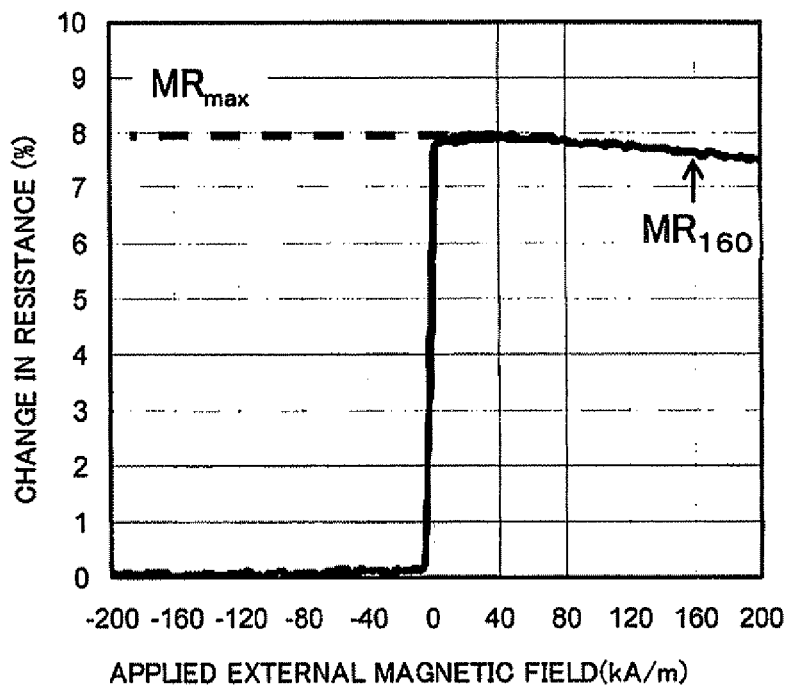
FIG. 2 is a diagram showing a change in resistance of the self-pinned SVGMR film according to the first example of the present invention.
Figure 2:
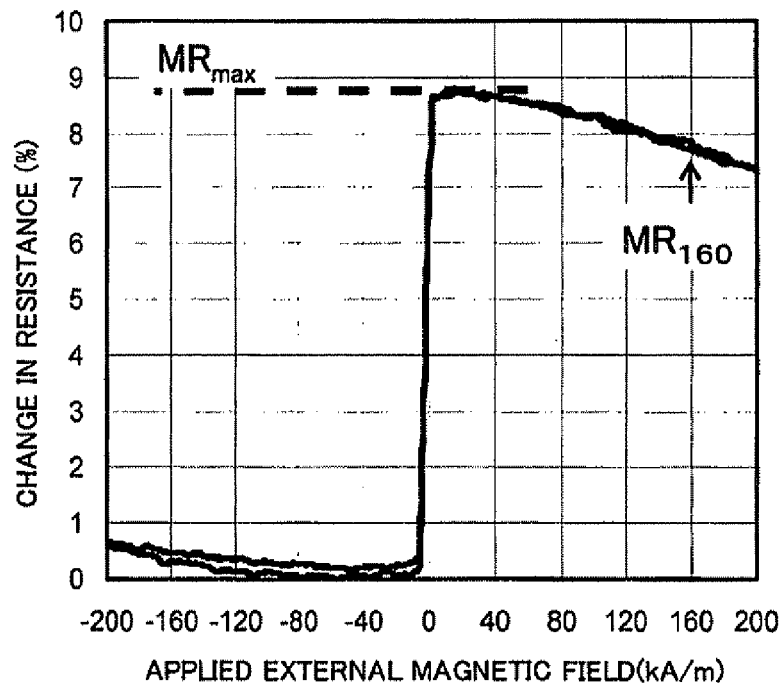

FIG. 2 shows an example of the change in resistance of the self-pinned SVGMR film of the present embodiment with respect to the external magnetic field H, as an MR-H curve. The MR-H curve is a curve having the external magnetic field H to be applied to the self-pinned SVGMR film on the X axis and the change in resistance of the self-pinned SVGMR film on the Y axis, and shows variation of the change in resistance with respect to the external magnetic field H. In the present embodiment, it is preferable that, in the MR-H curve, a ratio between a maximum change in resistance MRmax in a range of applied external magnetic field of ±160 (kA/m) and a change in resistance MR160 when 160 (kA/m) is applied, that is, MR160/MRmax, is greater than or equal to 95%.

MRmax indicates a maximum change in resistance of the self-pinned SVGMR film when the external magnetic field is applied in a range of ±160 (kA/m) [2000 (Oe)] in a same direction as the induction magnetization direction of the pinned layer 4, that is, the pinning direction. MR160 indicates the change in resistance of the self-pinned SVGMR film when the external magnetic field of 160 (kA/m) [2000 (Oe)] is applied in an opposite direction as the induction magnetization direction of the pinned layer 4, that is, the opposite direction of pinning direction. If the induction magnetization direction of the pinned layer 4 does not move with respect to the external magnetic field at all, MR160 and MRmax would have the same value, and the change in resistance is not reduced. In other words, as MR160/MRmax approaches 100%, the self-pinned SVGMR film can be considered as being superior in the magnetic field resistance, with the distortion of the pinned layer 4 caused when exposed to a strong external magnetic field being smaller and reduction of the change in resistance being lower.

The use, for the magnetoresistance effect element of the rotation angle sensor, of the self-pinned SVGMR film in which the change in resistance is reduced due to the strength of the external magnetic field is not preferable because angle error variation may be caused at a strong external magnetic field. With the use of the self-pinned SVGMR film having MR160/MRmax of greater than or equal to 95%, it is possible to obtain a rotation angle sensor which is superior in angle error even when the external magnetic field is strong.

In order to set MR160/MRmax to greater than or equal to 95%, the coupling magnetic field of the pinned layer 4 of the self-pinned SVGMR film may be increased, and, in order to do so, the coercive force of the pinned layer 4 may be increased. In the self-pinned SVGMR film of the related art, because the ground layer 2 and the pinned layer 4 are in contact with each other, the coercive force of the ferromagnetic layer 41 of the pinned layer 4 on the side near the ground layer 2 has been reduced. In the present embodiment, the non-magnetic layer 3 is inserted between the ground layer 2 and the pinned layer 4, and the ground layer 2 and the pinned layer 4 can be separated. Thus, the coercive force of the pinned layer 4 is increased and MR160/MRmax may be set to greater than or equal to 95%.

In the present embodiment, the coercive force of the ferromagnetic layer 41 of the pinned layer 4 on the side near the ground layer 2 is set to be greater than or equal to 12 (kA/m) [150 (Oe)]. As is already described, in order to lower the reduction of the change in resistance of the self-pinned SVGMR film at a strong external magnetic field, the coupling magnetic field of the pinned layer 4 may be increased, and, in order to do so, the coercive force of the ferromagnetic layer 41 of the pinned layer 4 on the side near the ground layer 2 may be increased. On the other hand, for the ferromagnetic layer 43 on the side near the intermediate layer 5, a soft magnetic material is used, and, thus, the coercive force of this layer can be ignored. In order to lower the reduction of the change in resistance of the self-pinned SVGMR film at the strong external magnetic field, the coercive force of the ferromagnetic layer 41 of the pinned layer 4 on the side near the ground layer 2 is preferably greater than or equal to 12 (kA/m) [150 (Oe)], and, is more preferably greater than or equal to 16 (kA/m) [200 (Oe)].

In this configuration also, because of the structure of the present embodiment in which the non-magnetic layer 3 is formed between the ground layer 2 and the pinned layer 4, the coercive force of the ferromagnetic layer 41 of the pinned layer 4 on the side near the ground layer 2 can be increased. In other words, when the non-magnetic layer 3 is formed between the ground layer 2 and the pinned layer 4, the ground layer 2 and the pinned layer 4 do not directly contact each other and can be separated, and thus the coercive force of the pinned layer 4 can be increased.

The self-pinned SVGMR film of the present embodiment preferably has a hysteresis width in the H direction of the MR-H curve being less tan or equal to 0.8 (KA/m). The MR-H curve shows a hysteresis loop around the magnetic field of zero, and the hysteresis width in the H direction refers to a loop width of the X axis direction (H direction) at a half height of the loop on the Y axis.

For example, the use of a self-pinned SVGMR film having a large hysteresis width in the H direction for the magnetoresistance effect element of a rotation angle sensor is not preferable because an angle error variation may be caused at a strong external magnetic field. In order to realize a rotation angle sensor with inhibited angle error variation, the self-pinned SVGMR film preferably has a hysteresis width in the H direction of the MR-H curve in a range of less than or equal to 0.8 (kA/m).

Figure 6:
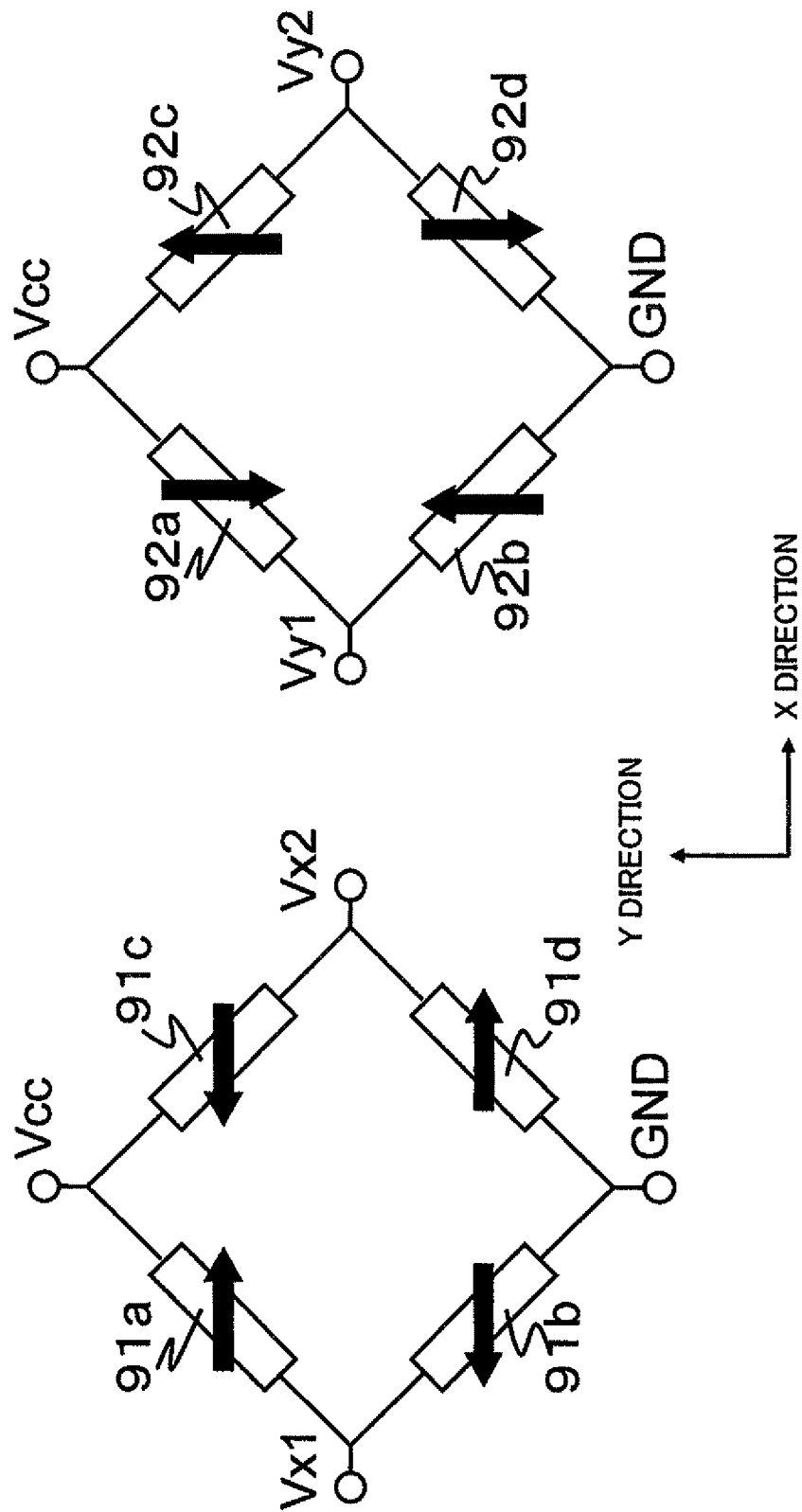
FIG. 6 is a circuit diagram of a magnetoresistance effect element according to the fifth example of the present invention.

As exemplified in FIG. 6, a magnetic sensor according to the present embodiment comprises 2n magnetoresistance effect elements (where n is an integer greater than or equal to 1) including the above-described self-pinned SVGMR film. Here, the magnetic sensor is constructed by setting the orientation directions of the pinned layers 4 in the same direction between the magnetoresistance effect elements or setting the orientation directions to form an angle of a multiple of an integer less than or equal to n of $\pi/n$ (rad), and connecting the magnetoresistance effect elements in a bridge form. FIG. 6 exemplifies a case of n=2, in which a Wheatstone bridge is formed using two pairs of magnetoresistance elements having the same orientation directions of pinned layers 4. The orientation directions of the pinned layers 4 of the magnetoresistance elements differ between the pairs by $\pi$ (rad), that is, 180°. In FIG. 6, a direction of an arrow represents the orientation direction of the pinned layer 4.

The magnetic sensor of the present embodiment is not limited to a case where the Wheatstone bridge is formed using the magnetoresistance effect elements as exemplified in FIG. 6. FIGS. 10-13 are explanatory diagrams showing example configurations where n half bridges are used to form the magnetic sensor, for n=1, 2, 3, and 4.

Figure 10:
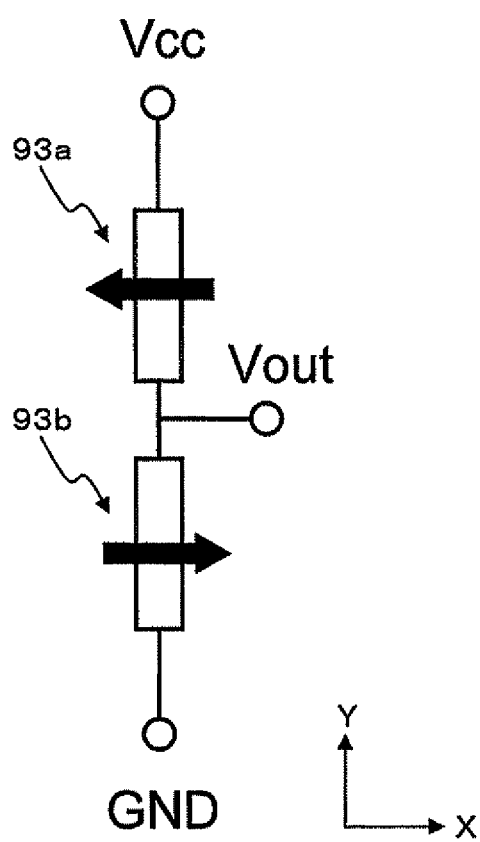
FIG. 10 is an explanatory diagram showing an example configuration when a magnetic sensor according to a preferred embodiment of the present invention is formed using one half bridge.

FIG. 10 shows an example configuration of n=1, that is, a configuration where two magnetoresistance effect elements 93a and 93b are connected in series between a power supply Vcc and a common terminal GND, and an output voltage Vout is extracted from the intermediate point (connection point between the magnetoresistance effect element 93a and the magnetoresistance effect element 93b). In this configuration, the orientation, directions of the pinned layers 4 of the magnetoresistance effect elements 93a and 93b are set to differ by $\pi/n=\pi(n=1)$.

Figure 11:
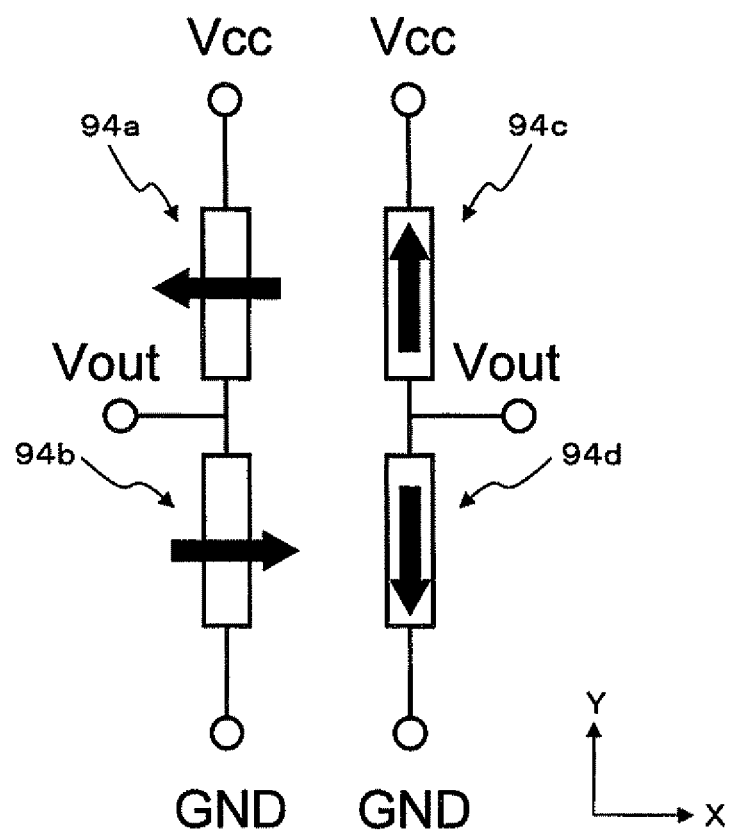
FIG. 11 is an explanatory diagram showing an example configuration in which a magnetic sensor according to a preferred embodiment of the present invention is formed using two half bridges.

FIG. 11 shows an example configuration of n=2, that is, a configuration where 4 magnetoresistance effect elements 94a-94d are used to form two half bridges. In this configuration, the magnetoresistance effect elements 94a and 94b are connected in series between the power supply Vcc and the common terminal GND, and an output voltage Vout is extracted from the intermediate point (connection point between the magnetoresistance effect element 94a and the magnetoresistance effect element 94b). In addition, the magnetoresistance effect elements 94c and 94d are connected in series between the power supply Vcc and the common terminal GND, and an output voltage Vout is extracted also from the intermediate point (connection point between the magnetoresistance effect element 94c and the magnetoresistance effect element 94d). In this configuration, the orientation directions of the pinned layers 4 of the magnetoresistance effect elements 94a-94d are set different from each other by a multiple of an integer n less than or equal to 2 of $\pi/n=\pi/2$ (n=2). The orientation directions of the pinned layers 4 of the paired magnetoresistance effect elements 94a and 94b are set different from each other by $\pi$. Similarly, the orientation directions of the pinned layers 4 of the paired magnetoresistance effect elements 94c and 94d are set different from each other by $\pi$.

Figure 12:
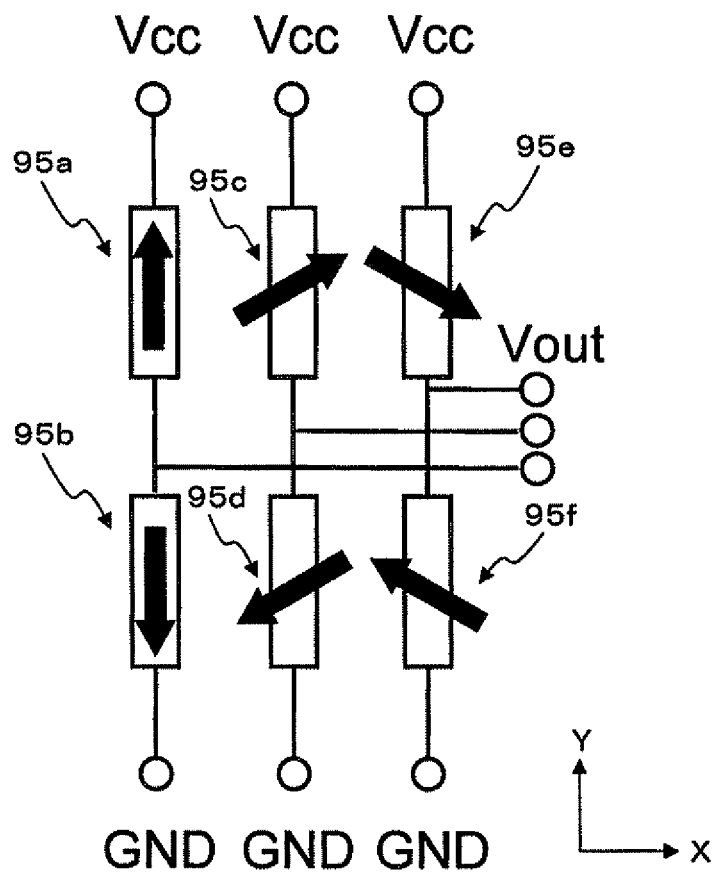
FIG. 12 is an explanatory diagram showing an example configuration in which a magnetic sensor according to a preferred embodiment of the present invention is formed using three half bridges.

FIG. 12 shows an example configuration of n=3, that is, a configuration where 6 magnetoresistance effect elements 95a-95f are used, to form 3 half bridges, by 3 pairs of 2 elements. In this configuration, two paired magnetoresistance effect elements 95 are connected in series between the power supply Vcc and the common terminal GND, and an output voltage Vout is extracted from the intermediate point (connection point between the magnetoresistance effect elements 95). In addition, the orientation directions of the pinned layers 4 of the magnetoresistance effect elements 95a-95f are set to differ from each other by a multiple of an integer n less than or equal to 3 of $\pi/n=\pi/3$ (n=3). The orientation directions of the pinned layers 4 of the paired magnetoresistance effect elements 95 forming a half bridge (for example, the magnetoresistance effect elements 95a and 95b) are set differing from each other by $\pi$.

Figure 13:
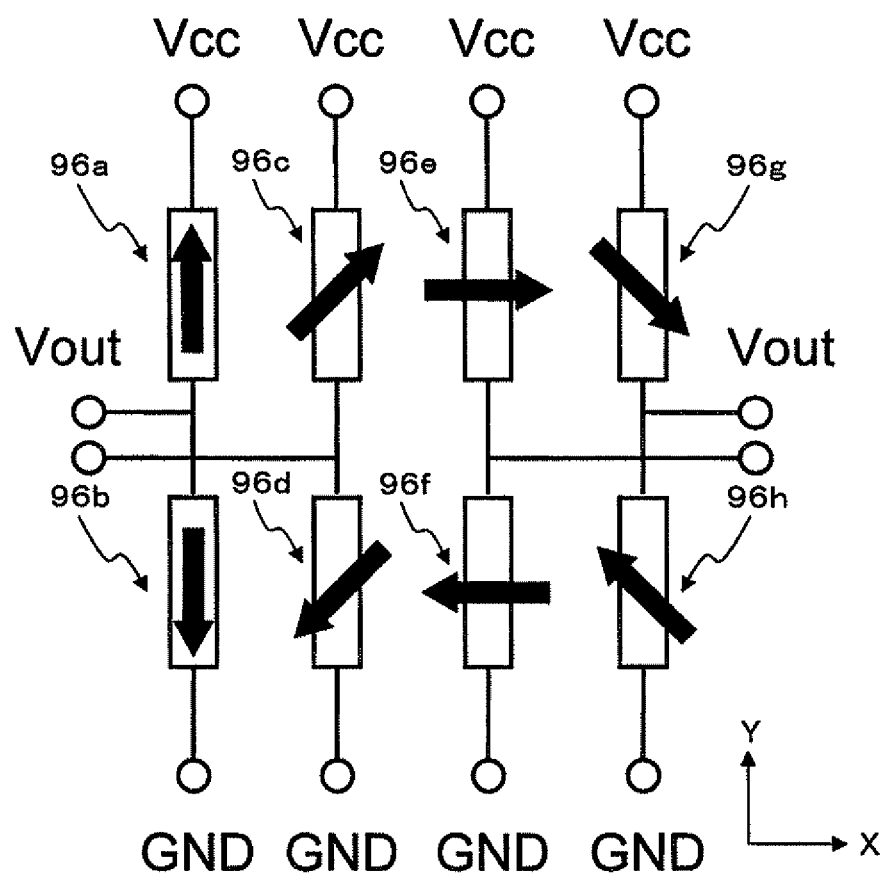
FIG. 13 is an explanatory diagram showing an example configuration in which a magnetic sensor according to a preferred embodiment of the present invention is formed using four half bridges.

FIG. 13 shows an example configuration of n=4, that is, a configuration where 8 magnetoresistance effect elements 96a-96h are used, to form 4 half bridges, by 4 pairs of 2 elements. In this example configuration, two paired magnetoresistance effect elements 96 are connected in series between the power supply Vcc and the common terminal GND, and an output voltage Vout is extracted from the intermediate point (connection point between the magnetoresistance effect elements 96). In addition, the orientation directions of the pinned layers 4 of the magnetoresistance effect elements 96a-96f are set differing from each other by a multiple of an integer n less than or equal to 4 of $\pi/n=\pi/4$ (n=4). The orientation directions of the pinned layers 4 of the paired magnetoresistance effect elements 96 forming a half bridge (for example, the magnetoresistance effect elements 96a and 96b) are set differing from each other by $\pi$.

The magnetic sensor according to the present embodiment is formed by connecting, in a bridge form, a plurality of magnetoresistance effect elements in which the self-pinned SVGMR films of the present embodiment are formed through patterning. For the patterning of the elements of the self-pinned SVGMR film, methods such as photolithography may be used. The plurality of magnetoresistance effect elements may be integrally formed over a same substrate or a combination of structures formed on separate substrates.

The magnetoresistance effect elements forming a part of the magnetic sensor are connected by pairing, for example, elements having orientation directions of the pinned layers 4 different from each other by 180°, and detecting a potential change at an intermediate point of the connection resistance. In other words, the number of the magnetoresistance effect elements is set to 2n (even number). The magnetic sensor of the present embodiment is a magnetic sensor for detecting a rotation angle of a target to be detected, and enables highly precise detection of the rotation angle of the target to be detected by providing a plurality of pairs of magnetoresistance effect elements having the orientation directions of the pinned layers different from each other by, for example, 180°. The signal process of the intermediate potential is simpler for a pair of magnetoresistance effect elements having equal angles of orientation directions of the pinned layers. Therefore, it is preferable to connect, in a bridge form, magnetoresistance effect elements having the same orientation directions of the pinned layers 4 or having an angle of a multiple of an integer less than or equal to n of $\pi/n$ (rad).

In the present embodiment, the magnetoresistance effect elements forming a part of the magnetic sensor comprises a self-pinned SVGMR film in which the ground layer 2, the pinned layer 4, the intermediate layer 5, the free layer 6, and the protection layer 7 are layered over a non-magnetic substrate in this order, and the non-magnetic layer 3 is formed between the ground film 2 and the pinned layer 4. By forming the non-magnetic layer 3, a rotation angle sensor having a small angle error variation at a strong external magnetic field can be achieved.

Alternatively, the rotation angle detection device of the present embodiment may comprise a magnetic rotor having a magnetic sensor and 2m pole magnets (wherein m is an integer greater than or equal to 1).

As the magnet, it is preferable to use a disc-shaped permanent magnet which is polarized in N and S multiple poles in the radial direction (N and S are alternately placed in the circumferential direction). As the material of the magnet, a rare earth element-based sintered magnet or a rare earth element-based bonded magnet may be used. The number of polarization poles can be suitably selected to facilitate obtaining the output signal of the magnetic sensor. The polarization spacing is generally preferably an equal spacing, but the polarization may alternatively be with an arbitrary spacing.

The magnetic sensor and the magnet are placed opposing each other with a spacing which is set in advance, to facilitate detection by the magnetic sensor of a leaking magnetic field from the magnet. The center of the placement of the magnetoresistance effect elements of the magnetic sensor and the center axis of the magnet may be coincided. The magnetic sensor may be used in an exposed state or, in consideration of the environmental tolerance, the magnetic sensor may be placed in a state of being mounted in a packaging or the like. A packaged magnetic sensor has an advantage that, even when the magnetic sensor is accidentally contacted with a magnet, the damages to the magnetoresistance effect element and the lines can be reduced.

EXAMPLES

First Example

As a first example of the present invention, a self-pinned SVGMR film was formed over a Si substrate of 6 inches across which is a non-magnetic substrate. For the film formation, a DC magnetron sputtering device having multi-chamber was used, and metal targets provided in the chambers were sequentially sputtered to form the self-pinned SVGMR film. As the metal targets, 7 targets including Ta, Fe, Ru, Cu, a NiFe alloy, a CoFe alloy, and a NiFeCr alloy were used. A plasma cleaning pretreatment was applied to the Si substrate in a cleaning chamber provided in the device, as a pretreatment for the formation of the self-pinned SVGMR film. The achieved degree of vacuum in the chambers before the film formation was set to be less than or equal to $5.0 \times 10^{-7}$ Pa.

FIG. 1 shows a structure of the self-pinned SVGMR film of the present example. FIG. 1 shows the layering relationship, and does not show the relative thicknesses of the layers. First, over the Si substrate of 6 inches across which was the non-magnetic substrate 1, a Ta layer functioning as the first ground layer 21 and having a thickness of approximately 30 Å and a NiFeCr alloy layer functioning as the second ground layer 22 and having a thickness of approximately 40 Å were formed as the ground layer 2. Over the ground layer 2, a Ta layer having a thickness of approximately 4 Å was formed as the non-magnetic layer 3, and, over the non-magnetic layer 3, the first ferromagnetic layer 41, the exchange coupling layer 42, and the second ferromagnetic layer 43 were formed as the pinned layer 4. The first ferromagnetic layer 41 was a CoFe alloy layer having a thickness of approximately 20 Å, the exchange coupling layer 42 was a Ru layer having a thickness of approximately 4 Å, and the second ferromagnetic layer 43 was a CoFe alloy layer having a thickness of approximately 20 Å. Then, a Cu layer having a thickness of approximately 20 Å was formed as the intermediate layer 5 which was a non-magnetic and conductive layer. As the free layer 6 having the ferromagnetic layer in which the magnetization direction changes corresponding to the external magnetic field via the intermediate layer 5, a CoFe alloy layer having a thickness of approximately 10 Å was formed as the first free layer 51 on the side near the intermediate layer 5, and a NiFe alloy layer having a thickness of approximately 40 Å was formed as the second free layer 52 on the side near the protection layer 7. Finally, a Ta layer having a thickness of approximately 30 Å was formed as the protection layer 7.

During formation of the first ferromagnetic layer 41 and the second ferromagnetic layer 42 which were a part of the pinned layer 4, an induction magnetic field of approximately 6 kA/m (80 Oe) was applied to the substrate using a permanent magnet provided on a film formation table. A relationship between the application direction of the induction magnetic field by the permanent magnet and the magnetization direction related to the first ferromagnetic layer 41 and the second ferromagnetic layer 42 will now be schematically described with reference to FIG. 1. FIG. 1 shows the magnetization directions of the ferromagnetic layers forming a part of the pinned layer 4 with arrows. When the first ferromagnetic layer 41 and the exchange coupling layer 42 are formed while applying the induction magnetic field from the left to the right of the drawing, the second ferromagnetic layer 43 is magnetized from the right to the left of FIG. 1 due to the effect of the exchange coupling layer 42. In this process, the pinning direction of the pinned layer 4 is in the magnetization direction of the second ferromagnetic layer 43 in contact with the intermediate layer 5, that is, from the right to the left in FIG. 1.

As a comparative example for confirming the advantage of the first Example, a self-pinned SVGMR film was formed having the same layer structure as the first Example except that the non-magnetic layer 3 was not formed. The film formation conditions for the layers in the Comparative Example other than the non-magnetic layer 3 were identical to those of the first Example.

Next, a magnetic field resistance was evaluated for the self-pinned SVGMR films of the first Example and the Comparative Example. The evaluation was performed by measuring a maximum change in resistance MRmax when an external magnetic field of ±160 kA/m [2000 (Oe)] was applied in a same direction as the induction magnetization direction of the pinned layer 4, that is, the pinning direction, and a change in resistance MR160 when an external magnetic field of 160 kA/m (2000 Oe) was applied in a direction opposite to the induction magnetization direction of the pinned layer 4, that is, the pinning direction, and comparing the magnetic field resistance based on a ratio of MRmax and MR160, that is, MR160/MRmax. As the ratio of MRmax and MR160 reaches 100%, that is, as the MRmax and MR160 become close to matching, the film may be considered as being superior in the magnetic field resistance and the change in resistance is not reduced due to the external magnetic field.

FIG. 2 shows a result of the magnetic field resistance evaluation for the first Example and the Comparative Example. For both the film of the first Example and the film of the Comparative Example, the change in resistance showed the maximum change in resistance MRmax around an applied external magnetic field of +20 kA/m (250 Oe), and showed a tendency of being reduced as the applied external magnetic field is increased. The film of the Comparative Example had a large reduction of the change in resistance with respect to the external electric field, and MR160/MRmax was 88%. On the other hand, the film of the first Example had a small reduction of the change in resistance with respect to the external magnetic field, and showed a superior magnetic field resistance with MR160/MRmax of 96%. Based on this result, it can be seen that, by inserting Ta to a thickness of approximately 4 Å as the non-magnetic layer 3 between the ground layer 2 and the pinned layer 4, it is possible to obtain a self-pinned SVGMR having a small reduction of the change in resistance even when an external magnetic field of 160 kA/m (2000 Oe) is applied.

Second Example

As a second Example, self-pinned SVGMR films were formed using the Ta layer as the non-magnetic layer 3, with a thickness of the Ta layer being varied from 1 Å to 20 Å. The self-pinned SVGMR films of the second Example were formed through the same film formation method as the first Example, and the thicknesses of the layers other than the non-magnetic layer 3 were set to be identical to those of the first Example.

For the films of the second Example, the magnetic field resistance was evaluated through a same method as that in the first Example. In addition, a Ta layer and a NiFeCr alloy layer functioning as the ground layer 2, a Ta layer functioning as the non-magnetic layer 3, and the first ferromagnetic layer 41 were formed over a glass substrate, and the coercive force of the first ferromagnetic layer 41 was measured by VSM.

Figure 3:
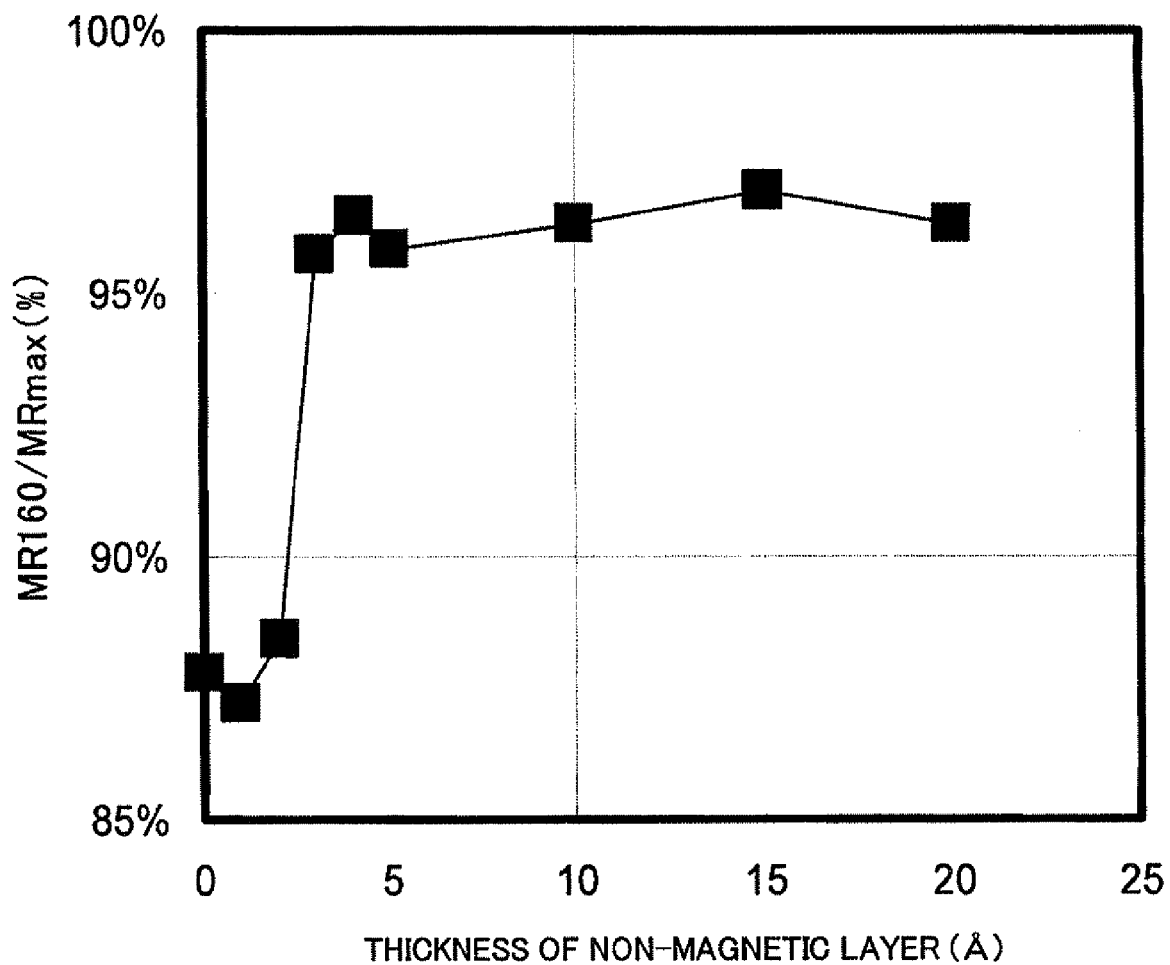
FIG. 3 is a diagram showing a relationship of a ratio between MR160 and MRmax with respect to a thickness of a non-magnetic layer according to a second example of the present invention.

FIG. 3 shows a result of evaluation of the relationship of MR160/MRmax with respect to the thickness of the non-magnetic layer 3 in the self-pinned SVGMR films of the second Example. FIG. 3 also shows a result of the Comparative Example of the first Example. For the thickness of the non-magnetic layer 3 of 1 Å and 2 Å, MR160/MRmax values were less than or equal to 90%. This result showed a value of approximately the same level as the Comparative Example of first Example in which the non-magnetic layer 3 was not inserted, and it was found that the spin valve SVGMR film with these thicknesses has relatively inferior magnetic field resistance. For thicknesses of the non-magnetic layer 3 of greater than or equal to 3 Å, MR160/MRmax values were greater than or equal to 95%, and it was found that a self-pinned SVGMR film having a superior magnetic field resistance with a small reduction of the change in resistance with respect to the external magnetic field can be obtained.

Figure 4:
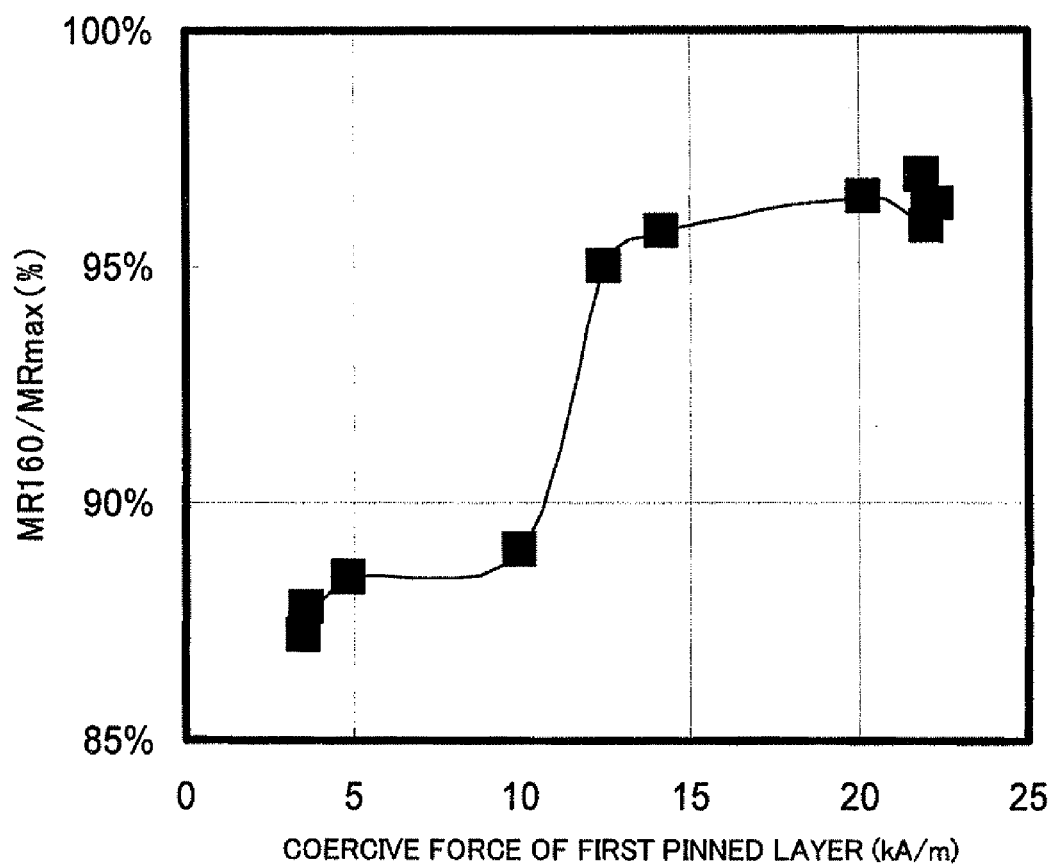
FIG. 4 is a diagram showing a relationship of a ratio between MR160 and MRmax with respect to a coercive force of a first pinned layer.

Next, FIG. 4 shows a result of evaluation of MR160/MRmax with respect to the coercive force of the first ferromagnetic layer 41. It can be seen that MR160/MRmax was low and less than or equal to 90% up to the coercive force of the first ferromagnetic layer 41 of 10 kA/m, and that these films had relatively inferior magnetic field resistance. However, as the coercive force of the first ferromagnetic layer 41 exceeded a value around 12 kA/m, MR160/MRmax was improved and became greater than or equal to 95%. This value of the coercive force of the first ferromagnetic layer 41 being around 12 kA/m means a thickness of the non-magnetic layer 3 of 2 Å~3 Å, and it can be seen that a point of inflection occurs between these thicknesses. In addition, this result coincides with the result of FIG. 3 that a superior magnetic field resistance was obtained at the thickness of the non-magnetic layer 3 of 3 Å. In order to achieve a self-pinned SVGMR film having a superior magnetic field resistance with a small reduction of the change in resistance with respect to the external magnetic field, it was found that the thickness of the non-magnetic layer 3 should be greater than or equal to 3 Å, that is, the coercive force of the first ferromagnetic layer should be greater than or equal to 12 (KA/m) [150 (Oe)].

Third Example

As another Example of the present invention, a plurality of self-pinned SVGMR films were formed using, as the material of the non-magnetic layer 3, Cu, Au, Al, Ti, Nb, and V which are pure metals, AlOx, MgO, TiO, CuO, NbO, and VOx which are oxides, SiC which is a carbide, and SiN which is a nitride. The self-pinned SVGMR films of the third Example were formed through the same film formation method as that of the first Example, and the non-magnetic layers 3 were formed by sputtering the targets of the materials which were prepared in advance. In all cases, the thickness of the non-magnetic layer 3 was set to 4 Å.

The formed films were evaluated for the magnetic field resistance through the same method as in the first Example, and it was found that, for all self-pinned SVGMR films, a self-pinned SVGMR film was obtained having a superior magnetic field resistance with relatively small reduction of the change in resistance with respect to the eternal magnetic field.

Fourth Example

As another Example of the present invention, a self-pinned SVGMR film was formed in which the non-magnetic layer 3 was formed by oxidizing the surface of the ground layer 2. The self-pinned SVGMR film of the fourth Example was formed by forming the non-magnetic layer 3 by oxidizing a surface of a NiFeCr alloy layer which was the second ground layer 22 after the NiFeCr alloy layer was formed during the sequential sputtering of the layers through the same process as those of the Comparative Example of the first Example. The oxidization of the surface of the NiFeCr alloy layer was performed by introducing oxygen into the sputtering chamber at 0° C., 1 atm, and a few tens of cm$^3$ per minute (a few tens sccm) after the NiFeCr alloy layer was sputtered, and leaving the Si substrate in the chamber which was then an oxygen atmosphere for 10 minutes. After formation of the self-pinned SVGMR film was completed, the film cross section was observed with TEM, and it was confirmed that the non-magnetic layer 3 was formed to a thickness of 4 Å as an oxidized layer of the alloy over the NiFeCr alloy layer which was the second ground layer 22.

The self-pinned SVGMR film in which the non-magnetic layer 3 was formed through the above-described method was evaluated for the magnetic field resistance through the same method as the first Example, and it was found that a self-pinned SVGMR film was obtained having a superior magnetic field resistance with a relatively small reduction of the change in resistance with respect to the external magnetic field.

Fifth Example

As another Example of the present invention, a magnetic sensor and a rotation angle detection device which use the self-pinned SVGMR film of the first Example were created.

Figure 5:
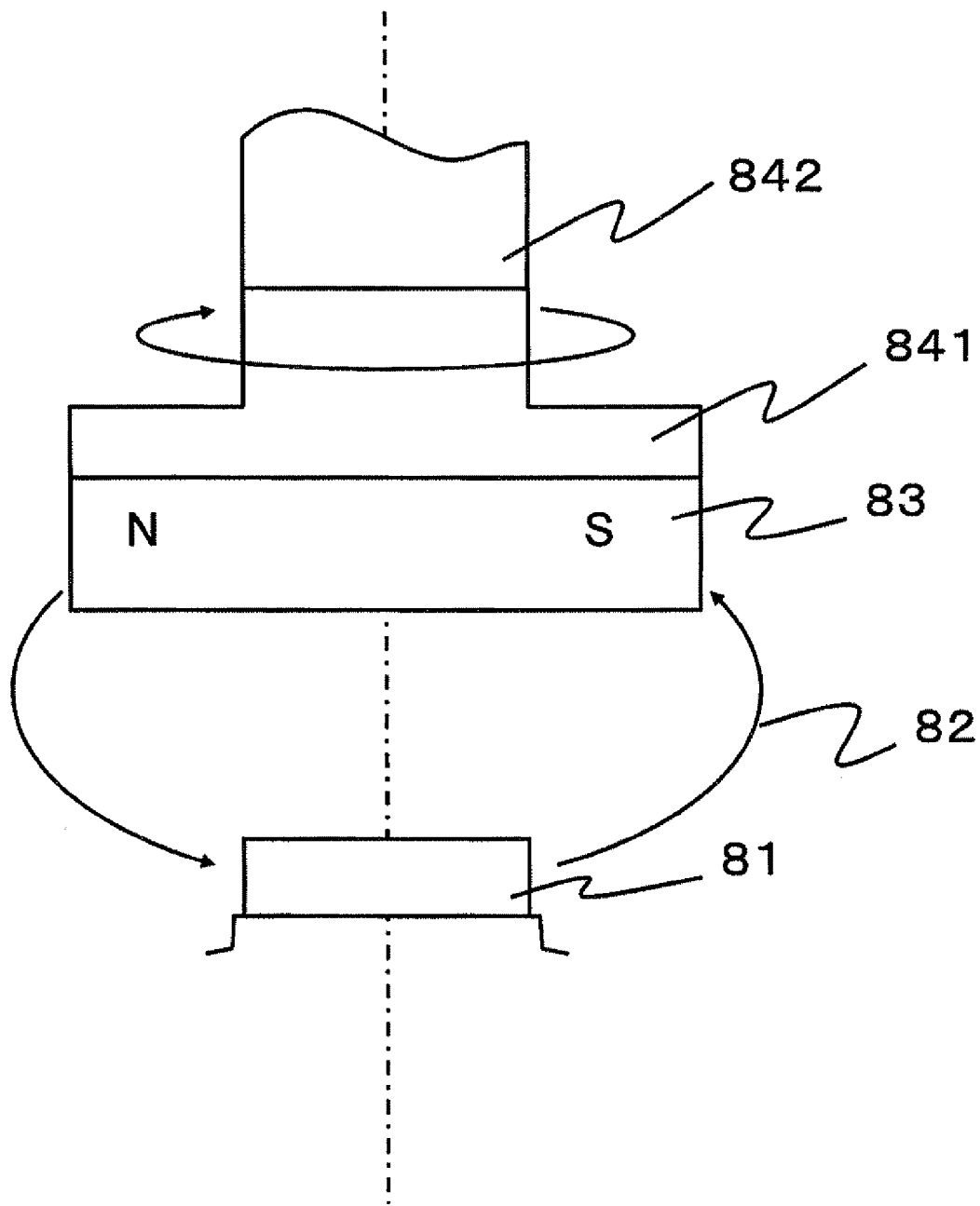
FIG. 5 is a diagram schematically showing a structure of a rotation angle detection device according to a fifth example of the present invention.

FIG. 5 schematically shows a structure of the rotation angle detection device of the fifth Example. In the device, a magnetic sensor 81 to be described later and a disc-shaped permanent magnet 83 polarized to two poles of N and S in the diameter direction were placed opposing each other. In other words, the permanent magnet 83 was a disc having a half-disc polarized to the N pole and a half-disc polarized to the S pole, combined together, and was fixed on a magnet mounting jig 841. The magnet mounting jig 841 was mechanically connected to a shaft 842 (rotational structure). Therefore, with a rotation of the shaft 842, the permanent magnet 83 was rotated. Due to the rotation of the permanent magnet 83, a distribution of a leaking magnetic field was changed. A dot-and-chain line shown in FIG. 5 corresponds to a center-of-rotation axis of the permanent magnet 83, and the center-of-rotation axis was in a relationship in the magnetic sensor 81 to perpendicularly intersect the sensor surface (that is, the center-of-rotation axis was in the direction of normal of the surface of the magnetic sensor 81). A solid line arrow 82 between the permanent magnet 83 and the magnetic sensor 81 represents a magnetic field line. With this structure, a change of a magnetic field from the permanent magnet 83 was detected by the magnetic sensor.

The magnetic sensor 81 was formed by connecting, in a bridge form, magnetoresistance effect elements 91 and 92 in which the self-pinned SVGMR films of the first Example were patterned. The self-pinned SVGMR film was patterned through the method of photolithography. By setting the induction magnetic field directions to directions differing from each other by 90° during the film formation of the self-pinned SVGMR film, 4 magnetoresistance effect elements having different directions were formed over the same substrate, and the magnetic sensor 81 was formed.

FIG. 6 shows a circuit diagram of the magnetoresistance effect element in which patterned self-pinned SVGMR films are connected in a bridge form. The circuit was formed in the magnetic sensor 81. In FIG. 6, a direction of a wide arrow represents a pinning direction of the pinned layer 4 of the self-pinned SVGMR film forming a part of the magnetoresistance effect elements 91 and 92. Sides of one terminal of magnetoresistance effect elements 91a and 91c having the pinning direction of the pinned layer 4 differing by $\pi$ (rad) from each other were connected to a power supply (Vcc). In addition, the side of one terminal of a magnetoresistance effect element 91b having the pinning direction of the pinned layer 4 differing from the magnetoresistance effect element 91a by $\pi$ (rad) and an output terminal Vx1 were connected to the side of the other terminal of the magnetoresistance effect element 91a. Moreover, a side of one terminal of a magnetoresistance effect element 91d having the pinning direction of the pinned, layer 4 differing from the magnetoresistance effect element 91c by $\pi$ (rad) and an output terminal Vx2 were connected to the side of the other terminal of the magnetoresistance effect element 91c. Furthermore, sides of the other terminal of the magnetoresistance effect elements 91b and 91d having the pinning direction of the pinned layer 4 differing from each other by $\pi$ (rad) were connected to each other and to a common terminal (GND). With this configuration, a Wheatstone bridge was formed with 4 magnetoresistance effect elements 91. The pinning directions of the pinned layers of the magnetoresistance effect elements 91a and 91d were identical (in a 0° direction with respect to a reference axis), and the pinning directions of the pinned layers of the magnetoresistance effect elements 91b and 91c were identical (in a 180° direction with respect to the reference axis). A power supply voltage Vcc having a predetermined potential was applied from the common terminal. The intermediate point potentials Vx1 and Vx2 were detected, and an output voltage Vx was obtained in the X direction of the figure based on the intermediate point potentials. A similar Wheatstone bridge was formed using magnetoresistance effect elements 92a~92d formed by rotating the pinning directions of the pinned layers 4 of these magnetoresistance effect elements by 90°. In the Wheatstone bridge using the magnetoresistance effect elements 92a~92d also, intermediate point potentials Vy1 and Vy2 are detected, and an output voltage Vy in the Y direction of the figure was obtained based on the intermediate point potentials.

Figure 7:
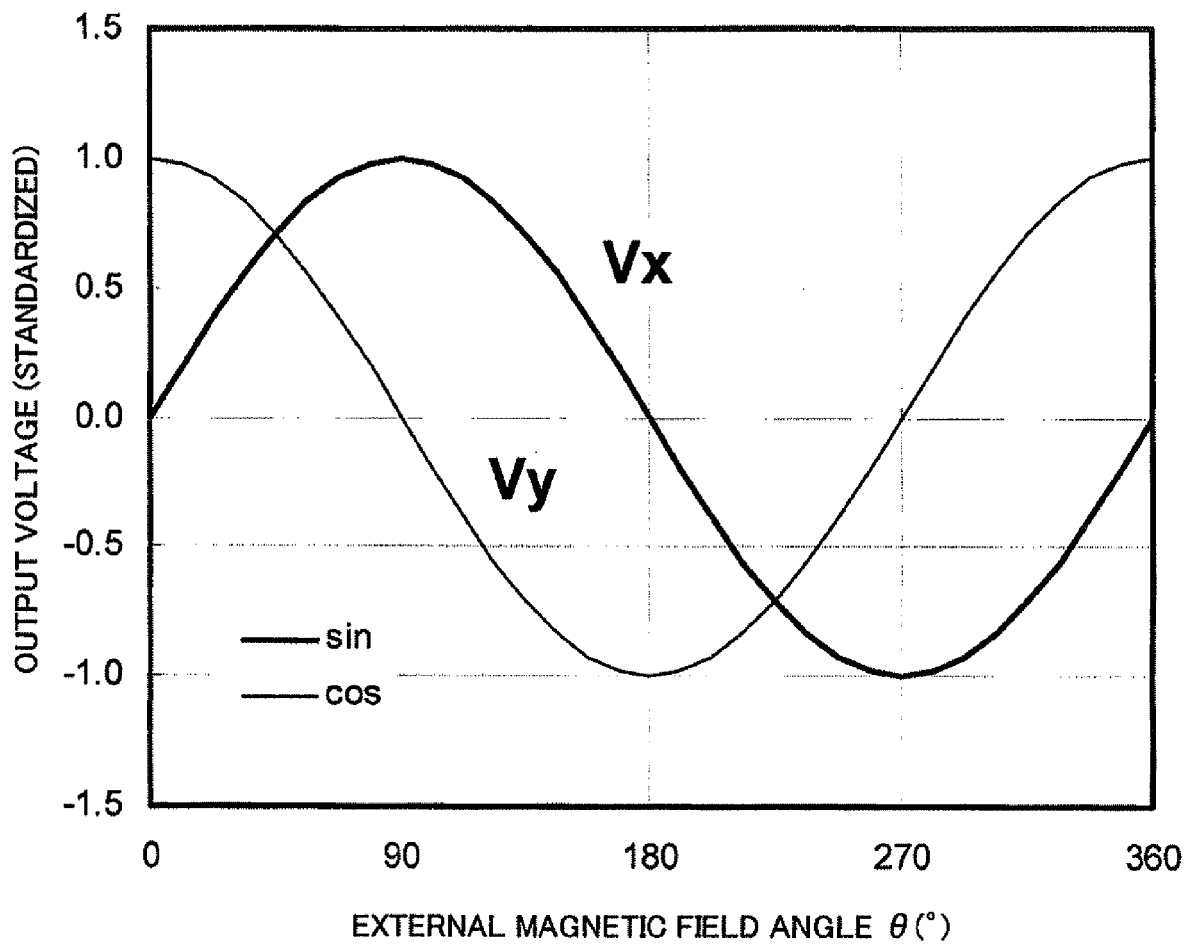
FIG. 7 is a diagram showing an output voltage of the magnetoresistance effect element according to the fifth example of the present invention.

When the permanent magnet 83 as shown in FIG. 5 was rotated and a magnetic field change of a sine wave shape was caused, the output voltages Vx and Vy became in the relationship of a sine wave and a cosine wave, respectively, as shown in FIG. 7. By applying an arctangent calculation ($\tan^{-1}$) based on these signals, an external magnetic field angle θcalc was obtained.

An angle error of a rotation angle detection device is represented as a difference between the external magnetic field angle θcalc and an actual rotational angle θapp of the permanent magnet 83. For the rotation angle detection device created in the fifth Example, the relationship between the external magnetic field (strength of the rotational magnetic field) and the angle error was evaluated. The strength of the external magnetic field was changed by changing a distance between the permanent magnet 83 and the magnetic sensor 81.

Figure 8:
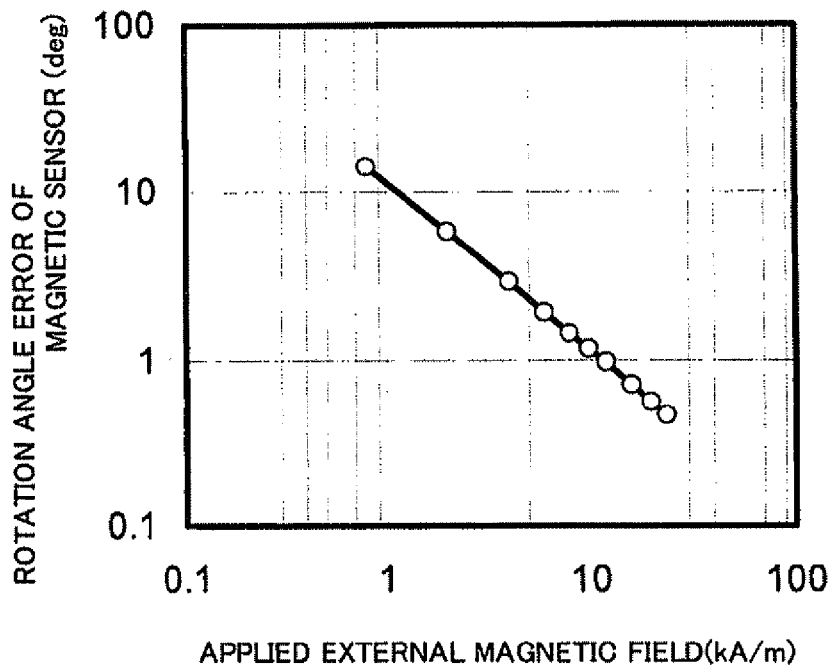
FIG. 8 is a diagram showing an angle error with respect to a strength of a rotational magnetic field according to the fifth example of the present invention.
Figure 8:
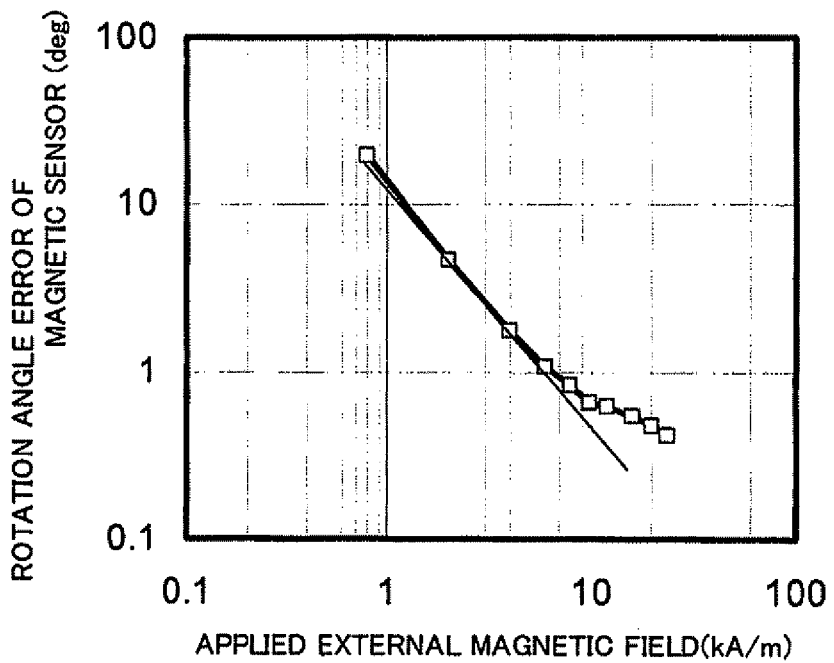

FIG. 8 shows a result of this evaluation. FIG. 8 also shows, as a Comparative Example, a result of evaluation when a magnetic sensor was created using the self-pinned SVGMR film of the Comparative Example of the first Example, a rotation angle detection device was formed, and evaluation was performed. The induction magnetic anisotropy Hk values of the films used in the creation of the magnetic sensor were Hk=104 A/m for the film of the first Example and Hk=119 A/m for the film of the Comparative Example of the first Example, and were not significantly different from each other.

In the rotation angle detection device of the Comparative Example, it can be seen that the angle error was reduced in a linear manner up to an applied external magnetic field of 8 kA/m [100 (Oe)], but the linearity of the angle error variation is lost for the applied external magnetic field of greater strengths. This is because the change in resistance of the self-pinned SVGMR film was reduced as the external magnetic field was increased, and is not preferable as it means that the angle error varies at a strong external magnetic field. In the rotation angle detection device of the fifth Example, the angle error has varied linearly with respect to the rotational magnetic field strength, and a rotation angle detection device was obtained having a superior angle error variation.

Sixth Example

As another Example of the present invention, a rotation angle error was calculated through a simulation for a case where magnetic sensors are created using the self-pinned SVGMR films having different thicknesses for the non-magnetic layer 3 and rotation angle detection devices are formed.

Figure 9:
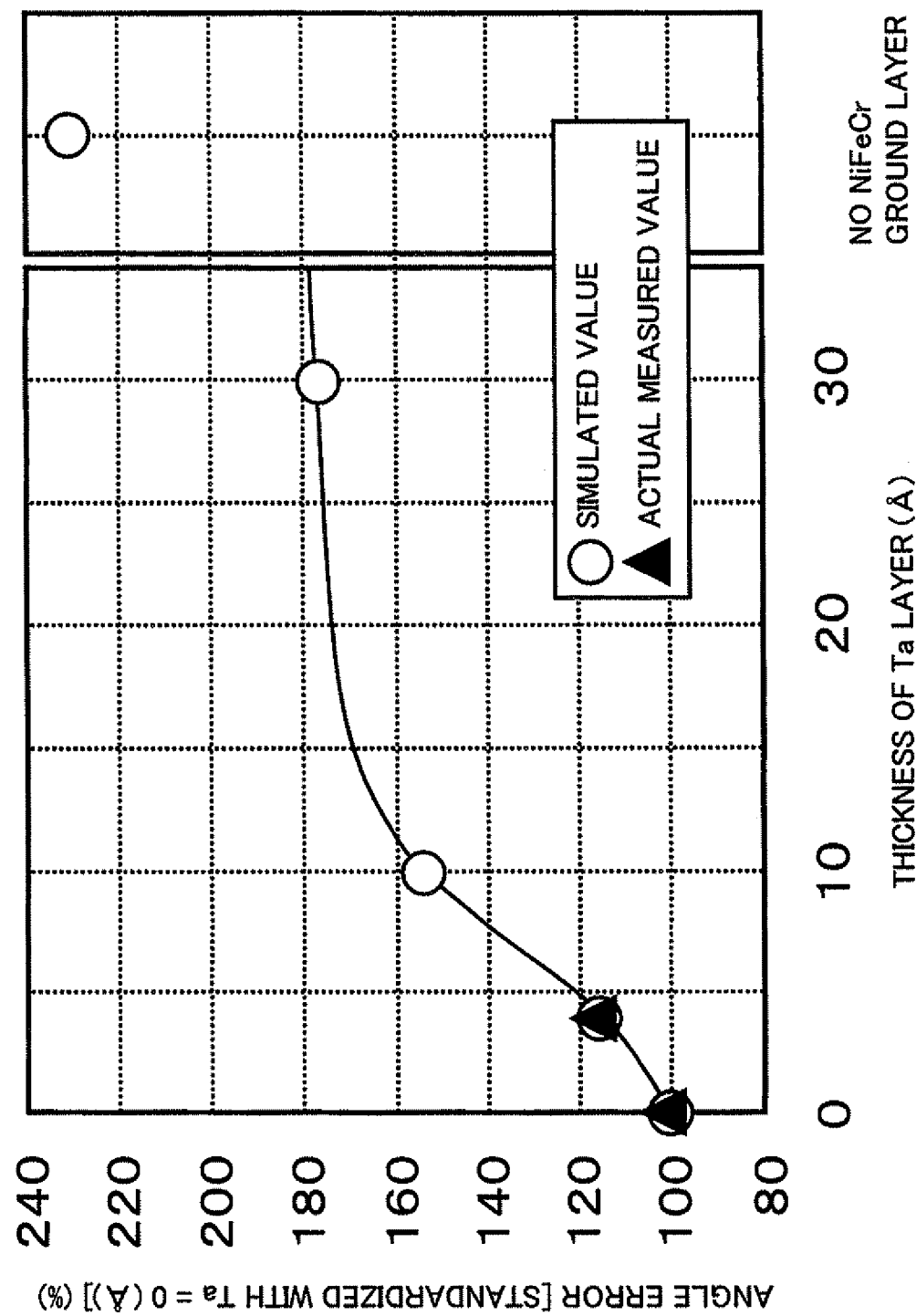
FIG. 9 is a diagram showing a simulation result of an angle error with respect to a strength of a rotational magnetic field according to a sixth example of the present invention.

FIG. 9 shows a simulation result of a rotation angle error when the induction magnetic anisotropy Hk of the free layer was changed by changing the thickness of the Ta layer of the non-magnetic layer 3. In the simulation, the values of the induction magnetic anisotropy Hk as the parameter was set to:
Hk=104 A/m [1.3 (Oe)] when Ta=0 Å;
Hk=119 A/m [1.5 (Oe)] when Ta=4 Å;
Hk=159 A/m [2.0 (Oe)] when Ta=10 Å;
Hk=183 A/m [2.3 (Oe)] when Ta=30 Å; and
Hk=239 A/m [3.0 (Oe)] when there is no NiFeCr ground effect (when there is no NiFeCr ground layer).
The other parameters of the magnetic characteristics were set to constant values, and the actual measured values of the Example 5 and the Comparative Example of Example 5 are also shown. The actual measured value of Hk was read from the MR-H curve of the self-pinned SVGMR film.

FIG. 9 shows how the rotation angle error changes when the value of induction magnetic anisotropy Hk changes. All values of Hk are standardized by the value of Hk obtained from the MR-H curve of the self-pinned SVGMR film having the thickness of the non-magnetic layer 3 of 0 Å. Based on FIG. 9, it can be seen that the simulated values and the actual values approximately match each other, and, at the same time, it can be seen that the angle error becomes larger as the Ta layer which is the non-magnetic layer 3 is thickened. This is because, as the Ta layer is thickened, the value of Hk is enlarged, and it becomes more difficult for the magnetization direction of the free layer to be parallel to the external magnetic field. Therefore, in order to obtain a rotation angle sensor having a high precision, an increased value for Hk is not preferable.

The angle error showed a tendency that it was abruptly increased in a range where the Ta layer is thin, and was saturated around a range where the thickness of the Ta layer exceeds 10 Å. The saturation level, however, was lower than the level when there is no NiFeCr ground effect. This is because the Ta ground layer itself has an advantage to increase the crystal orientation of the pinned layer, though such an advantage is weak.

Based on FIG. 9, it can be determined that, when the angle error of the magnetic sensor is desired to be kept within an increase of 50% with respect to a level for a case where there is no non-magnetic layer 3, the thickness of the non-magnetic layer 3 is preferably less than or equal to 10 Å, and, when a higher precision is required and the angle error is desired to be kept within an increase of 20%, the thickness of the non-magnetic layer 3 is preferably less than or equal to 5 Å.

1 non-magnetic substrate,
2 ground layer,
21 first ground layer,
22 second ground layer,
3 non-magnetic layer,
4 pinned layer,
41 first ferromagnetic layer,
42 exchange coupling layer,
43 second ferromagnetic layer,
5 intermediate layer,
6 free layer,
61 first free layer,
62 second free layer,
10 free layer,
7 protection layer,
81 magnetic sensor,
82 magnetic field line,
83 permanent magnet,
841 magnet mounting jig,
842 shaft,
91a-91d, 92a-92d magnetoresistance effect elements.

The invention claimed is:

1. A self-pinned spin valve magnetoresistance effect film comprising a ground layer, a pinned layer, an intermediate layer, a free layer, and a protection layer sequentially layered over a non-magnetic substrate, wherein
   a non-magnetic layer is formed between the ground layer and the pinned layer,
   a thickness of the non-magnetic layer is greater than or equal to 3 Å, and less than 5 Å,
   a coercive force of a ferromagnetic layer of the pinned layer on a side near the ground layer is greater than or equal to 12 (KA/m), and
   a ratio MR160/MRmax between a maximum change in resistance MRmax in a range of an applied external magnetic field of ±160 (kA/m) and a change in resistance MR160 when an external magnetic field of 160 (kA/m) is applied in an MR-H curve representing the relationship between the change in resistance MR and the external magnetic field H, is greater than or equal to 95%.

2. The self-pinned spin valve magnetoresistance effect film according to claim 1, wherein
   the non-magnetic layer is formed by at least one layer selected from a metal, a metal oxide, a metal carbide, and a metal nitride.

3. The self-pinned spin valve magnetoresistance effect film according to claim 1, wherein
   the non-magnetic layer is at least one layer of one or more metal selected from Ta, V, Ti, Zr, Y, Hf, W, Re, Os, Ir, Pt, Nb, Mo, Ru, Rh, Pd, Al, Cu, Ag, Au, Fe, Ni, and Co, an alloy thereof, an oxide thereof, a carbide thereof, and a nitride thereof.

4. The self-pinned spin valve magnetoresistance effect film according to claim 1, wherein
   the non-magnetic layer is an oxide of a metal of the ground layer in which a surface of the ground layer on a side near the pinned layer is oxidized.

5. A magnetic sensor comprising:
   2n magnetoresistance effect elements (wherein n is an integer of greater than or equal to 1) in each of which a self-pinned spin valve magnetoresistance effect film comprising a ground layer, a pinned layer, an intermediate layer, a free layer, and a protection layer sequentially layered over a non-magnetic substrate are connected in a bridge form,
   wherein a non-magnetic layer is formed between the ground layer and the pinned layer,
   a thickness of the non-magnetic layer is greater than or equal to 3 Å, and less than 5 Å,
   a coercive force of a ferromagnetic layer of the pinned layer on a side near the ground layer is greater than or equal to 12 (KA/m),
   a ratio MR160/MRmax between a maximum change in resistance MRmax in a range of an applied external magnetic field of ±160 (kA/m) and a change in resistance MR160 when an external magnetic field of 160 (kA/m) is applied in an MR-H curve representing the relationship between the change in resistance MR and the external magnetic field H, is greater than or equal to 95%, and
   orientation directions of the pinned layers of the magnetoresistance effect elements are the same or have an angle of a multiple of an integer less than or equal to n of $\pi/n$ (rad).

6. A rotation angle detection device comprising:
   a magnetic rotor having 2m pole magnets (wherein m is an integer greater than or equal to 1), and
   a magnet sensor wherein 2n magnetoresistance effect elements (wherein n is an integer of greater than or equal to 1) in each of which a self-pinned spin valve magnetoresistance effect film comprising a ground layer, a pinned layer, an intermediate layer, a free layer, and a protection layer sequentially layered over a non-magnetic substrate are connected in a bridge from, wherein a non-magnetic layer is formed between the ground layer and the pinned layer,
   a thickness of the non-magnetic layer is greater than or equal to 3 Å, and less than 5 Å, a coercive force of a ferromagnetic layer of the pinned layer on a side near the ground layer is greater than or equal to 12 (KA/m), a ratio MR160/MRmax between a maximum change in resistance MRmax in a range of an applied external magnetic field of ±160 (kA/m) and a change in resistance MR160 when an external magnetic field of 160 (kA/m) is applied in an MR-H curve representing the relationship between the change in resistance MR and the external magnetic field H, is greater than or equal to 95%, and orientation directions of the pinned layers of the magnetoresistance effect elements are the same or have an angle of a multiple of an integer less than or equal to n of $\pi/n$ (rad).

* * * * *